(12) United States Patent
Chen

(10) Patent No.: US 7,134,896 B1
(45) Date of Patent: Nov. 14, 2006

(54) LATCH OF A CARD EDGE CONNECTOR

(75) Inventor: Wan-Tien Chen, Taipei (TW)

(73) Assignee: Egbon Electronics Ltd., Taipei (TW)

( * ) Notice: Subject to any disclaimer, the term of this patent is extended or adjusted under 35 U.S.C. 154(b) by 0 days.

(21) Appl. No.: 11/239,161

(22) Filed: Sep. 30, 2005

(51) Int. Cl.
*H01R 13/62* (2006.01)

(52) U.S. Cl. ...................................... 439/326

(58) Field of Classification Search ................. 439/328, 439/326, 325
See application file for complete search history.

(56) References Cited

U.S. PATENT DOCUMENTS 5,268,820 A * 12/1993 Tseng et al. ................. 361/785
6,743,028 B1 * 6/2004 Wang ............................ 439/92
6,971,899 B1 * 12/2005 Liu ............................. 439/326
7,004,764 B1 * 2/2006 Boudreau et al. ............. 439/74

* cited by examiner

*Primary Examiner*—Tulsidas C. Patel
*Assistant Examiner*—PhuongChi Nguyen
(74) *Attorney, Agent, or Firm*—Lowe Hauptman & Berner LLP

(57) ABSTRACT

A latch of a card edge connector comprising: an elongated body, having a outside wall with an extending wall, wherein a trench is formed between the outside wall and the extending wall, and the extending wall has an opening and a pin; and a latching device, having a knot and a pinhole used for joining the opening and the pin of the extending wall respectively, and having at least a buckle and a chuck, the buckle is used for locking a circuit card when a side part of the circuit card is pressed down the buckle, then the chuck is used for driving the buckle moving and releasing the circuit card.

16 Claims, 11 Drawing Sheets

US 7,134,896 B1

LATCH OF A CARD EDGE CONNECTOR

BACKGROUND OF THE INVENTION

1. Field of the Invention

The present invention relates to a latch of a card edge connector, and more particularly to a latch of a card edge connector used for various interface cards, memory cards or expending cards.

2. Description of the Prior Art

A plurality of card edge connectors are widely used in common computers for inserting interface cards, memory cards or expending cards to increase new appliances or functions.

Conventional designations of card edge connectors include a standing or a sitting type for space consideration of computers such as notebook computers. A usage of the sitting type of the card edge connector is that a circuit card is inserted into a socket with an angle of 45 degrees then the circuit card is pressed down and locked by a latch of the card edge connector.

The latch of the sitting type of the conventional card edge connector is formed integrally and extended on two sides of the card edge connector. Two supporting arms are thus formed then two buckles are formed on distal ends of the two supporting. As a result, when a side part of a circuit card is inserted into a socket and another side part of the circuit card is pressed down, the circuit card is locked by the two buckles of the two supporting arms and positioned between the buckles and the card edge connector.

Although an object for locking a circuit card with the latch of the sitting type of the conventional card edge connector can be achieved, fatigues of the two supporting arms would easily occur then causing deformations after long time use, or breakdowns by error operating. Besides, locking effects for fixing a circuit card with buckles of distal ends of two supporting arms could be deficient, that is, the conventional card edge connectors could not lock circuit cards tightly and firmly.

SUMMARY OF THE INVENTION

An objective of the present invention is to solve the above-mentioned problems and to provide a latch of a card edge connector that can lock various interface cards, memory cards or expending cards tightly and firmly with improved feature of the latch characterized by separation of the latch from the card edge connector and a simple structure, easy assembly and manufacturing.

The present invention achieves the above-indicated objective by providing a latch of a card edge connector, wherein the latch is located on a certain plane directly toward a socket of the card edge connector. The latch comprises an elongated body and a latching device. The elongated body has a side wall with an extending wall, wherein a trench is formed between the side wall and the extending wall, and the extending wall has an opening and a pin. The latching device has a knot and a pinhole used for joining the opening and the pin of the extending wall respectively, and has at least a buckle and a chuck, wherein the buckle is used for locking a circuit card when a side part of the circuit card is pressed down the buckle, and the chuck is used for driving the buckle moving and releasing the circuit card.

The following detailed description, given by way of example and not intended to limit the invention solely to the embodiments described herein, will best be understood in conjunction with the accompanying drawings.

DETAILED DESCRIPTION OF THE PREFERRED EMBODIMENTS

Figure 1:
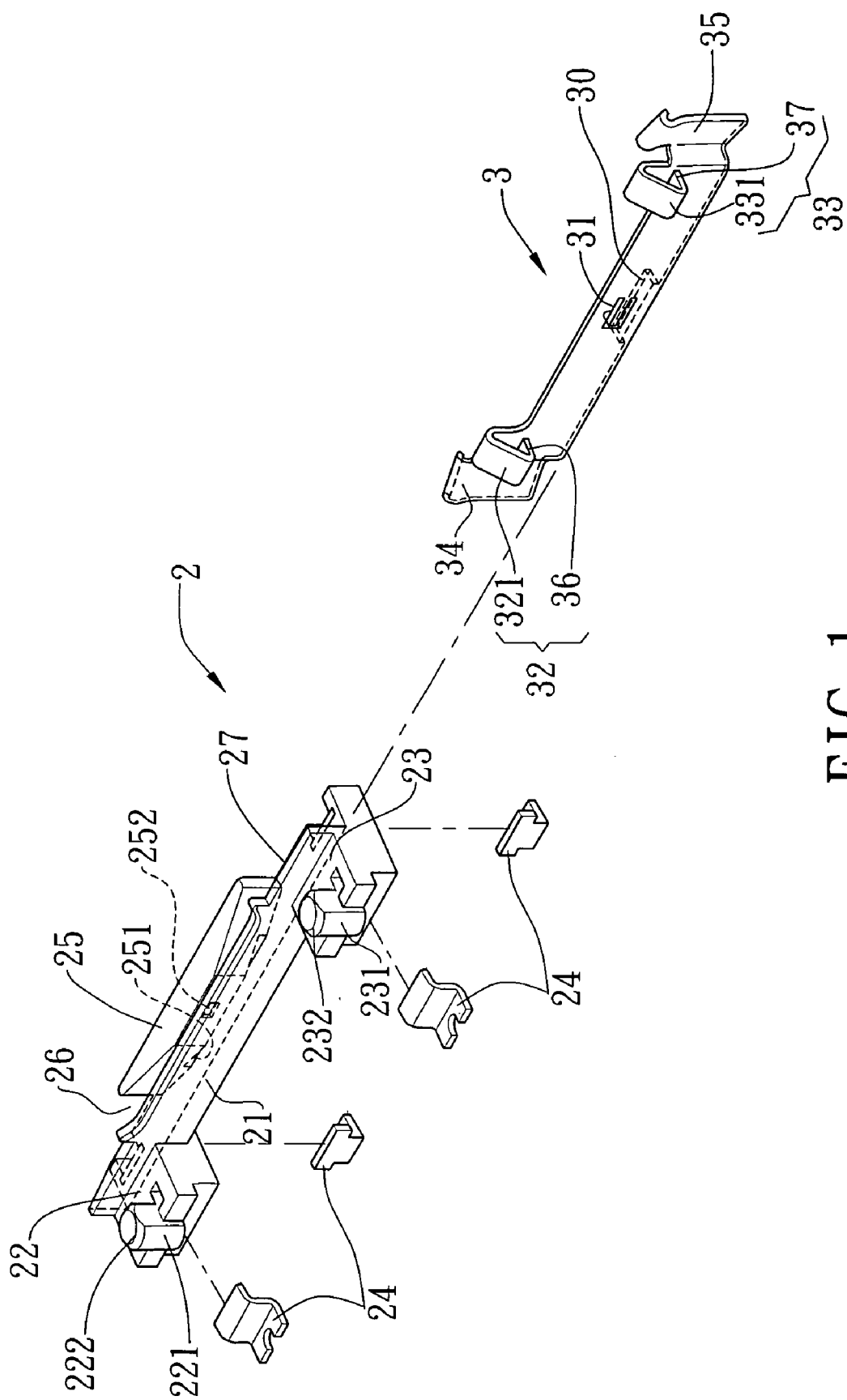
FIG. 1 is a partly exploded perspective view of a latch of a card edge connector of a preferred embodiment of the present invention.
Figure 2:
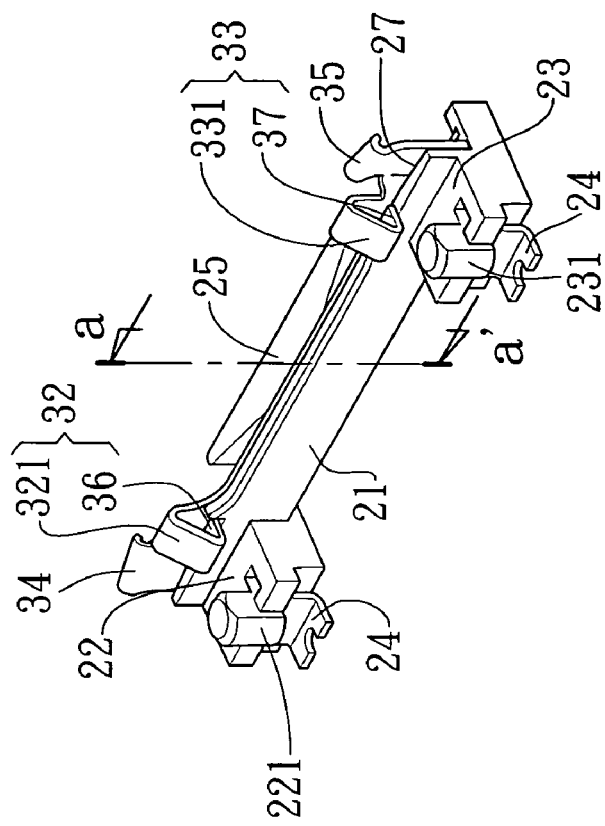
FIG. 2 is a perspective view of a card edge connector and a latch of a preferred embodiment of the present invention.
Figure 2:
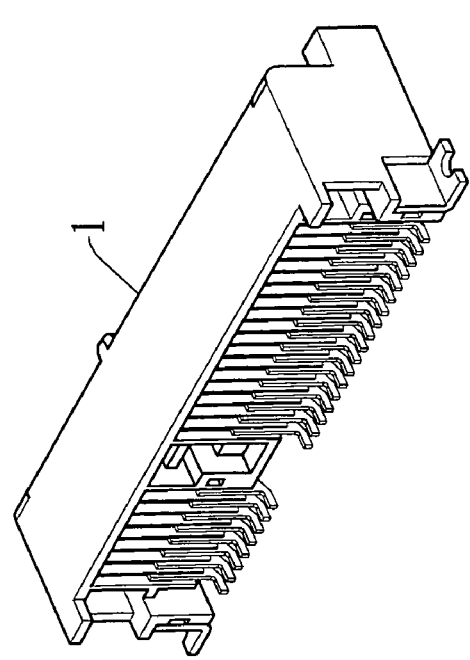
Figure 3:
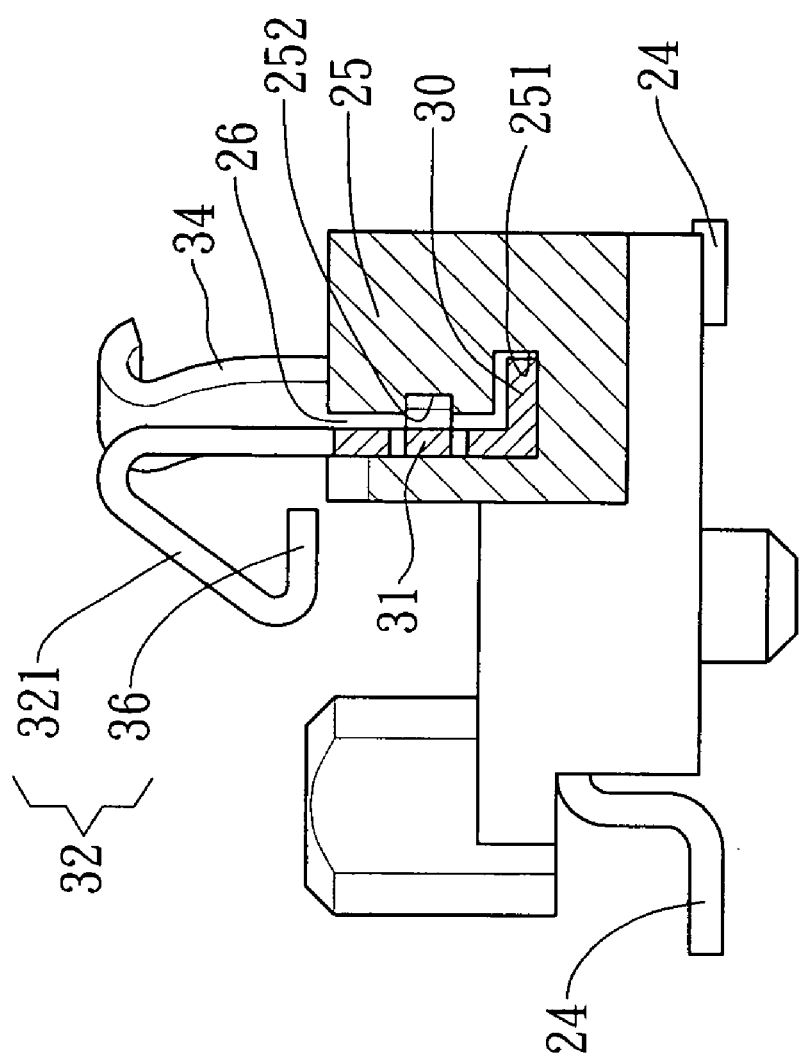
FIG. 3 is an a–a' cross-section view of FIG. 2.
Figure 4:
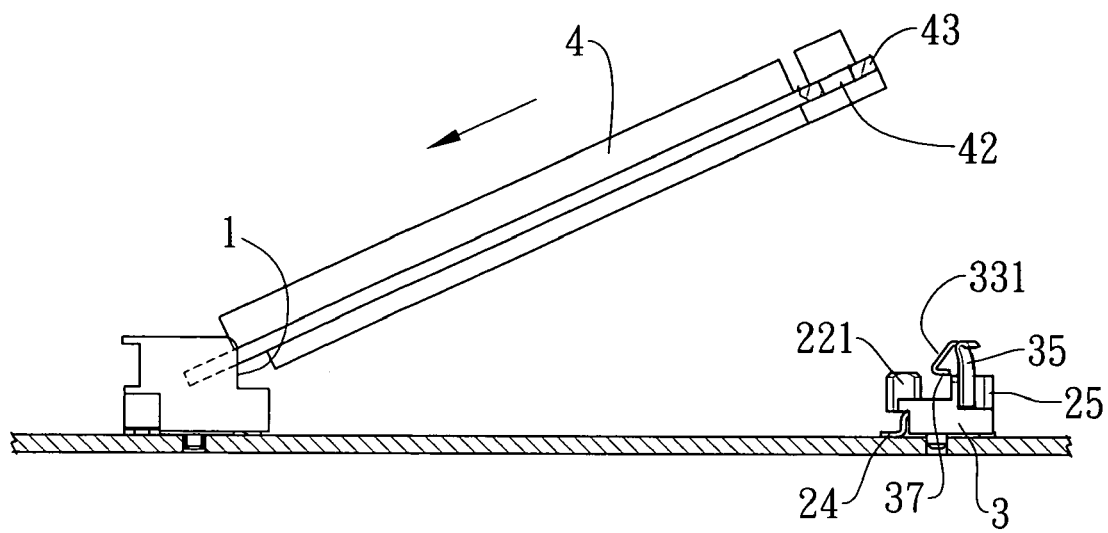
FIG. 4 is a cross-section view showing a status of a circuit card connecting with the card edge connector of a preferred embodiment of the present invention.
Figure 5:
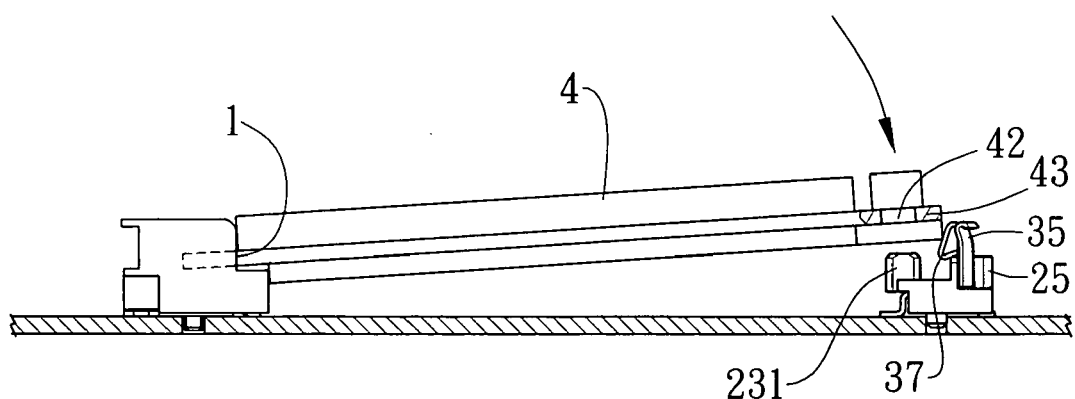
FIG. 5 is a cross-section view showing a status of the circuit card reaching an inclined plane of the latch of a preferred embodiment of the present invention.
Figure 6:
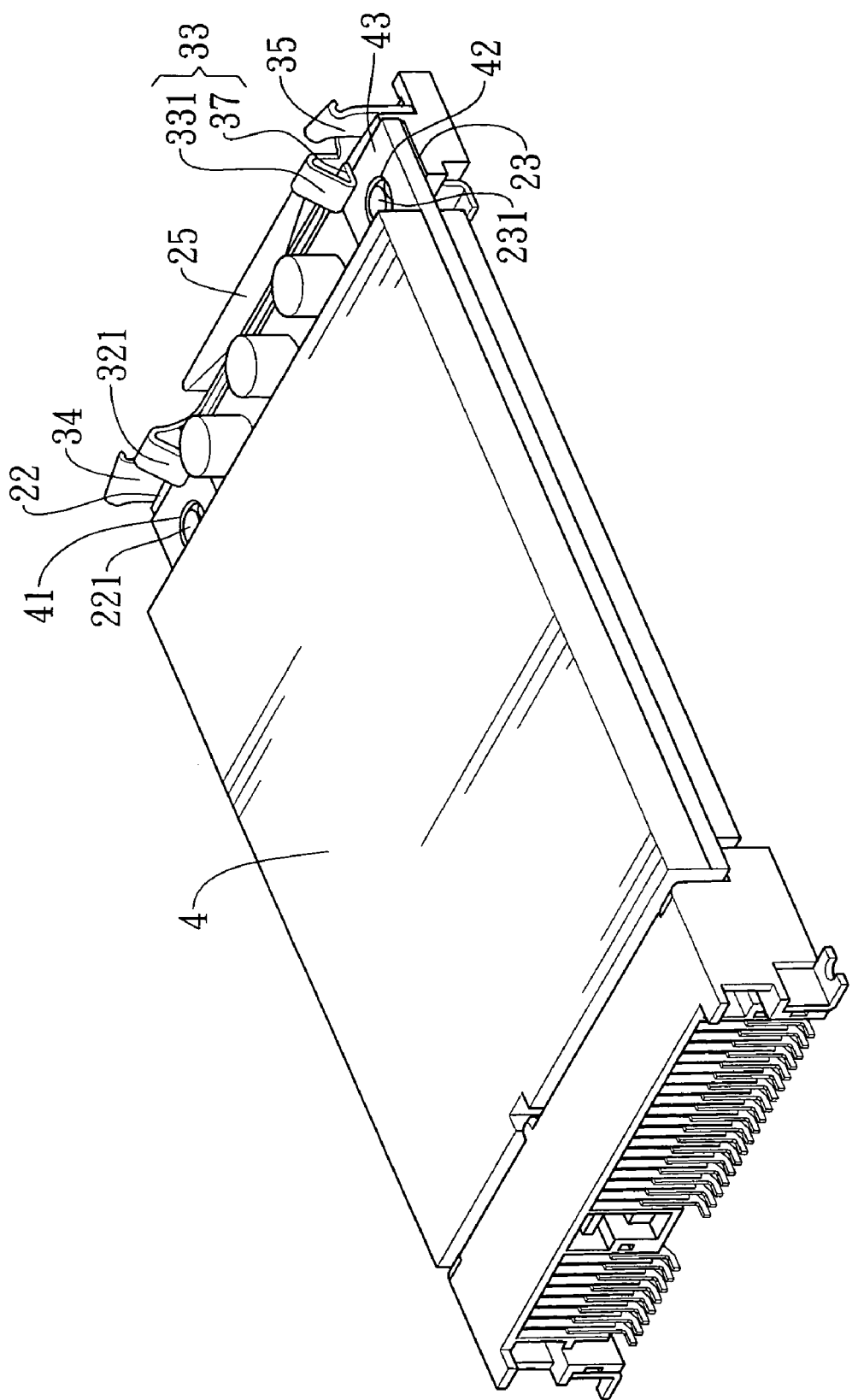
FIG. 6 is a perspective view of the latch of FIG. 2 into which a circuit card is fixed.

FIGS. 1–5 show an aspect of the latch of a card edge connector of a preferred embodiment of the present invention. The latch (not labeled) includes an elongated body 2 and a latching device 3, as shown in FIG. 1. The latch is located on a certain plane directly toward a socket 1 of a card edge connector (not labeled), as shown in FIG. 2.

The elongated body 2 includes an inside wall 21 and an outside wall 27. The inside wall 21 is directly toward the socket 1. Two platforms 22 and 23 are located on the inside wall 21 of the elongated body 2 for placing a circuit card 4. Two bulges 221 and 231 are located on the same side of the platforms 22 and 23 respectively. The bulges 221 and 231 are used for connecting with linking holes 41 and 42 of one side of the circuit card 4. Two guiding angles 222 and 232 are located on the top of the bulges 221 and 231 for connecting the bulges 221 and 231 with the linking holes 41 and 42 smoothly. The outside wall 27 has an extending wall 25. A trench 26 is thus formed between the outside wall 27 and the extending wall 25. An opening 251 and a pin 252 are located on the extending wall 25.

A knot 30 and a pinhole 31 are located on the latching device 3. The knot 30 can move into the opening 251 and stop moving, until the pin 252 of the extending wall 25 joining the pinhole 31, when the latching device 3 slips into the trench 26 from one end of the trench 26. The latching device 3 includes two buckles 32 and 33 and two chucks 34 and 35. The two buckles 32 and 33 are located on the latching device 3 separately and extended from the outside wall 27 toward the inside wall 21. The two buckles 32 and 33 are formed like a hook shape and can fasten tops of the elongated body 2. The buckles 32 and 33 each includes inclined planes 321 and 331, and pushing parts 36 and 37.

A side part 43 of the circuit card 4 is pressed down the inclined planes 321 and 331 of the buckles 32 and 33 then forced on the platforms 22 and 23 of the elongated body 2 against the pushing parts 36 and 37 when the circuit card 4 is connected. The two chucks 34 and 35 are formed on each side of the latching device 3 respectively and can drive the buckles 32 and 33 moving when the chucks 34 and 35 are stirred.

A practice of a preferred embodiment of the present invention can be seen in FIGS. 2–6. Firstly, the latching device 3 slips into the trench 26 from one end of the trench 26. The pin 252 of the extending wall 25 joins the pinhole 31 of the latching device 3 immediately when the knot 30 reaches the opening 251. Thus, an assembled entity of the latch of a preferred embodiment of the present invention is implemented then the buckles 32 and 33 can just fasten tops of the elongated body 2 after assembled, as shown in FIGS. 2–6.

As shown in FIGS. 2, 4–6, the assembled entity of the latch is located on a certain plane directly toward the socket 1, that is, the inside wall 21 of the elongated body 2 directly toward the socket 1. The side part 43 of the circuit card 4, such as an interface card, memory card or expending card, is pressed down the inclined planes 321 and 331 of the buckles 32 and 33 causing the inclined planes 321 and 331 constrained toward inside, then the side part 43 is forced on the platforms 22 and 23 of the elongated body 2 and the bulges 221 and 231 are just located in the linking holes 41 and 42 of the side part 43, when another side of the circuit card 4 is inserted into the socket 1 with an angle of 45 degrees. Meanwhile, the buckles 32 and 33 recover from constrained immediately causing the pushing parts 36 and 37 of the buckles 32 and 33 pressing the side part 43 located on the platforms 22 and 23 when the side part 43 passes through the inclined planes 321 and 331 of the buckles 32 and 33.

Figure 7:
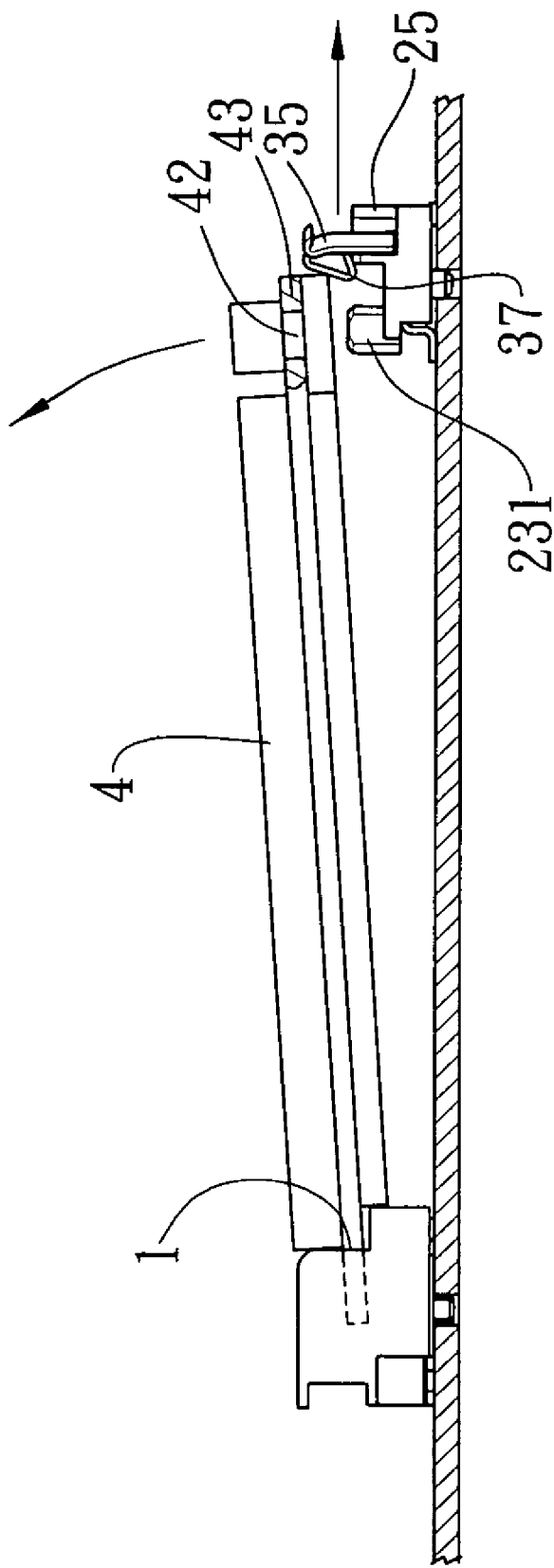
FIG. 7 is a cross-section view showing a status of the circuit card released by stirring a chuck of a preferred embodiment of the present invention.

FIG. 7 is a cross-section view showing a status of the circuit card released by stirring a chuck of a preferred embodiment of the present invention. To substitute the circuit card 4, the latching device 3 can drive the buckles 32 and 33 moving via a propelling force caused by extending wall 25, when the chucks 34 and 35 are stirred by a user, as shown in FIG. 7. The side part 43 is then released from a status that it is pressed by the pushing parts 36 and 37. Thus, the circuit card 4 can be substituted.

Figure 8:
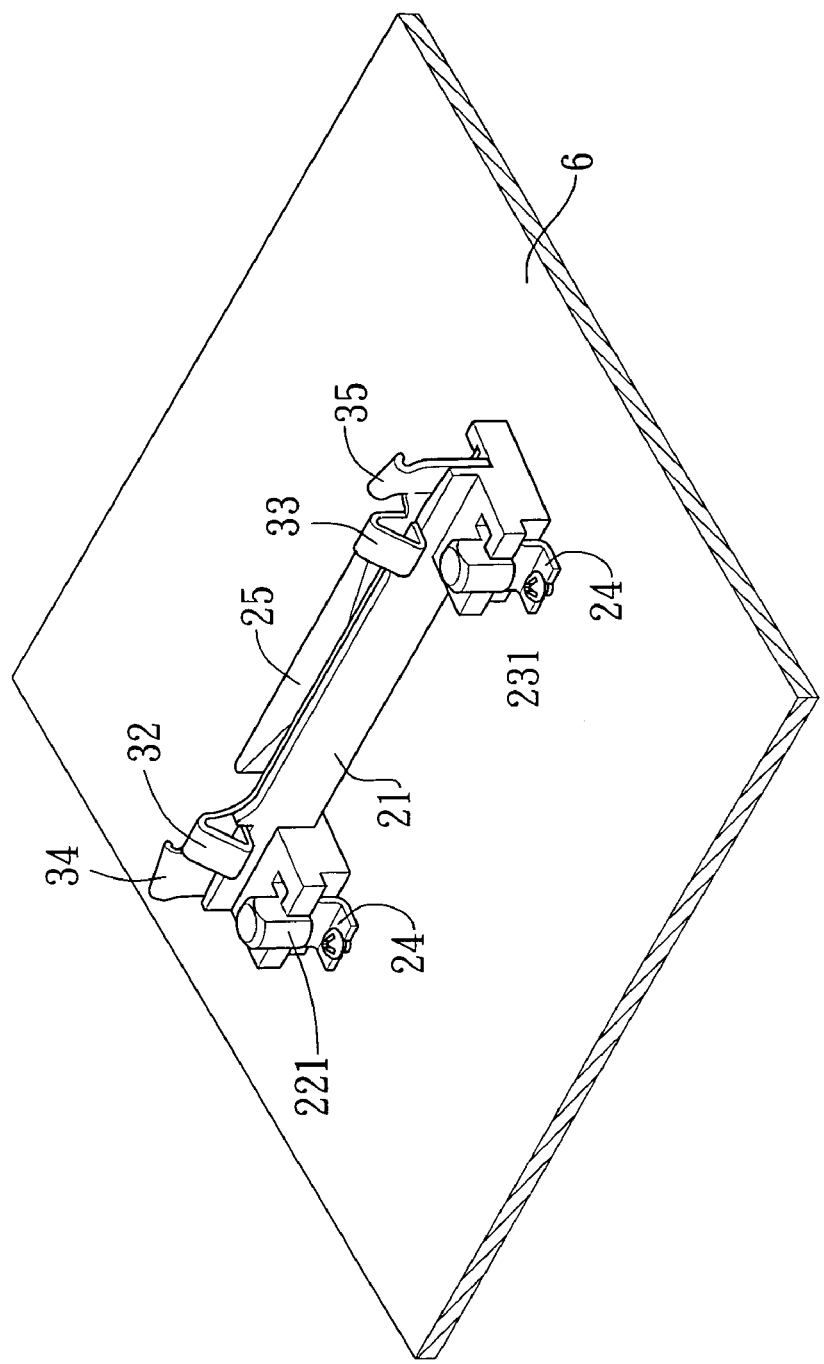
FIG. 8 is a perspective view of the latch fixed on a printed circuit board by screwing of a preferred embodiment of the present invention.
Figure 9:
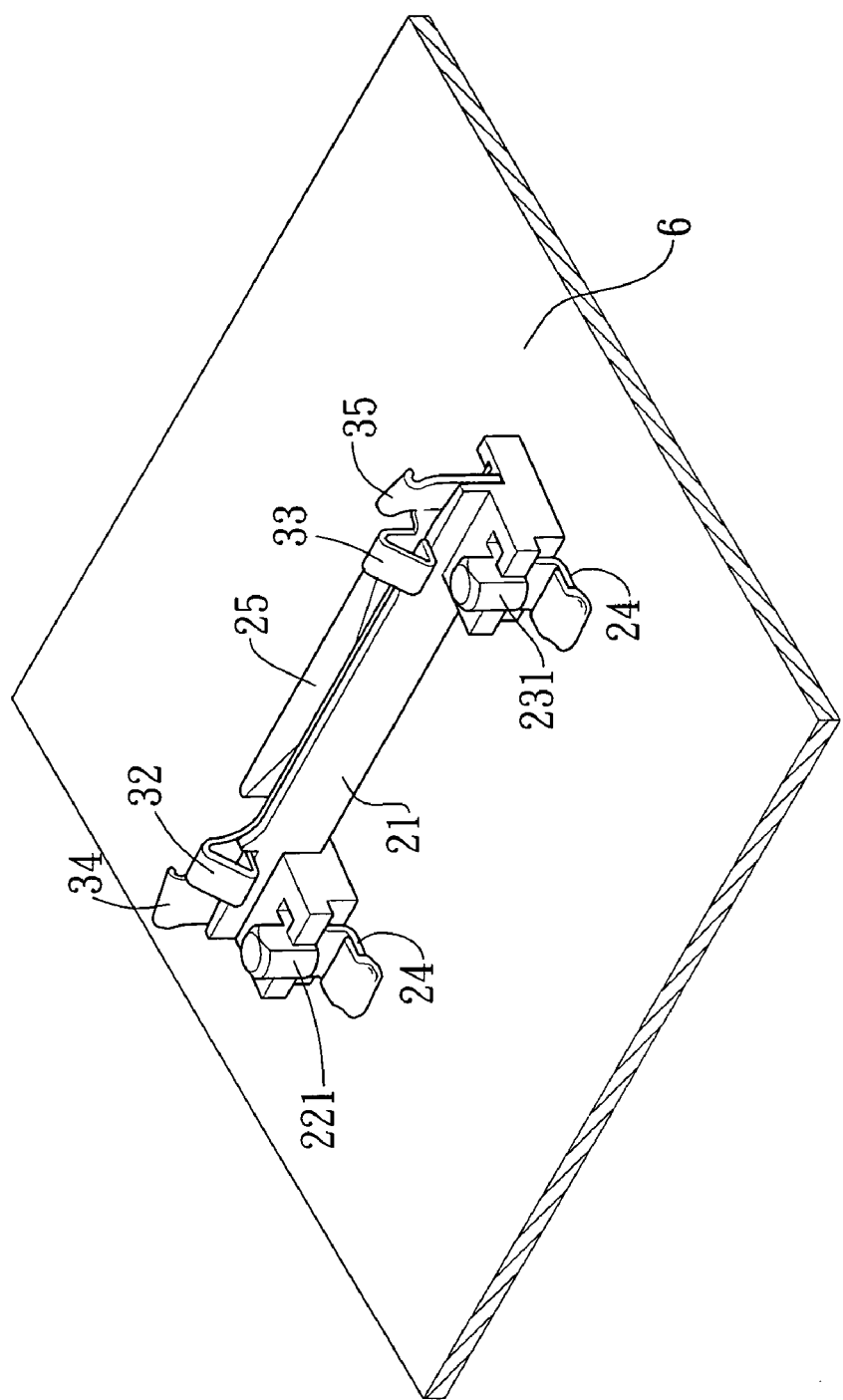
FIG. 9 is a perspective view of the latch fixed on a printed circuit board by welding of a preferred embodiment of the present invention.

As shown in FIG. 8 and FIG. 9, two joint parts 24 are located on bottoms of the elongated body 2 and used for joining a printed circuit board 6. FIG. 8 is a perspective view of the elongated body 2 fixed on the printed circuit board 6 by screwing. FIG. 9 is a perspective view of the elongated body 2 fixed on the printed circuit board 6 by welding. Thus, the elongated 2 can be fixed on the printed circuit board 6 stably.

Figure 10:
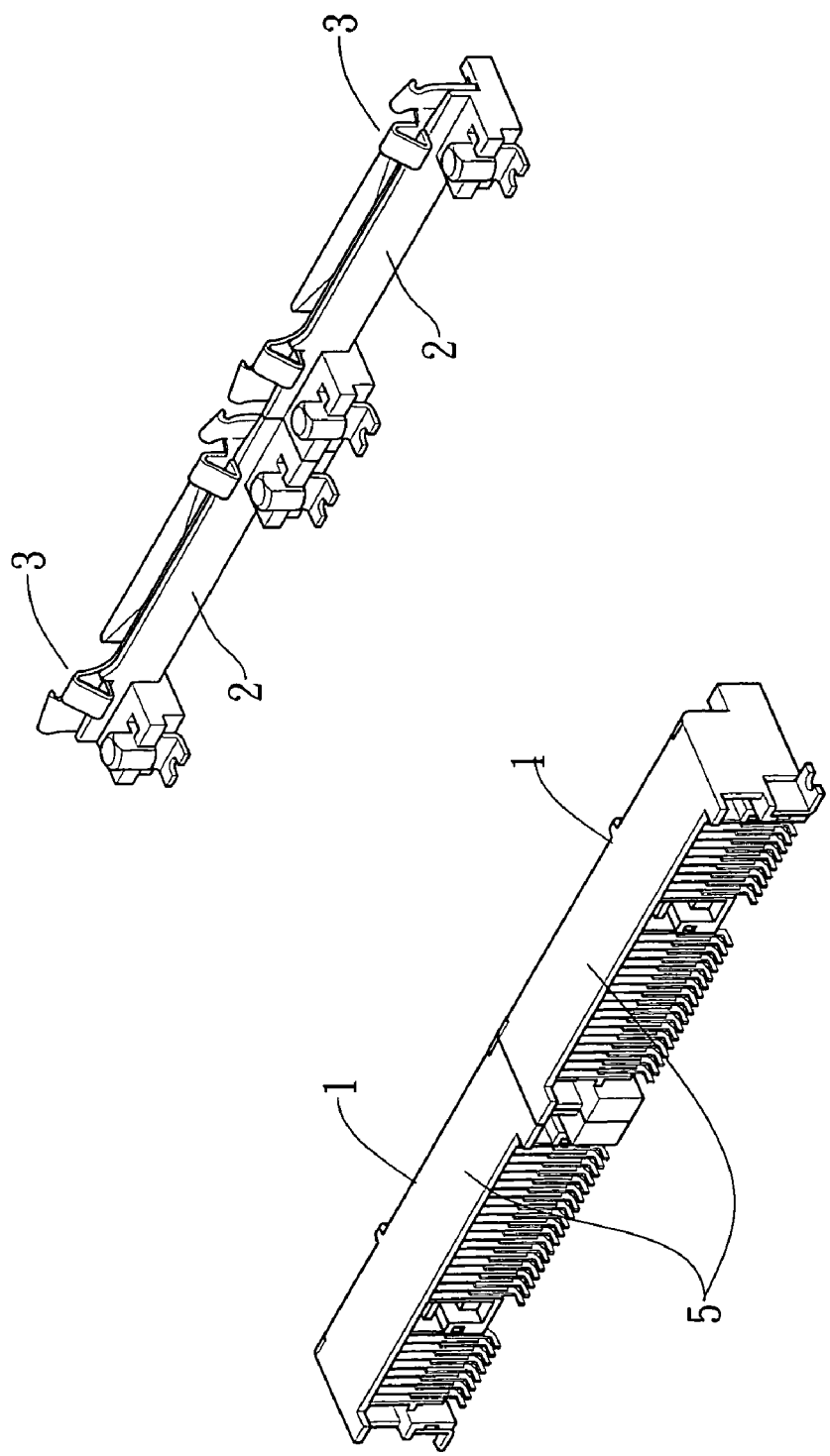
FIG. 10 is a perspective view of a set of two card edge connectors and two latches formed for two circuit cards inserted leftward and rightward according the present invention.
Figure 11:
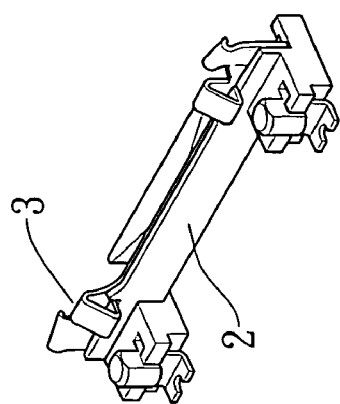
FIG. 11 is a perspective view of an alternative set of two card edge connectors and two latches formed for two circuit cards inserted forward and backward according the present invention.
Figure 11:
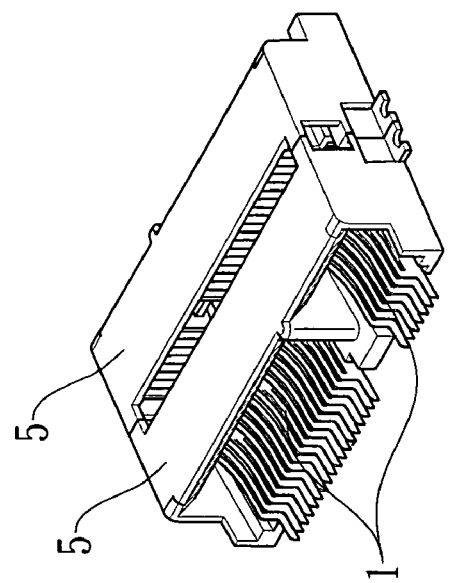
Figure 11:
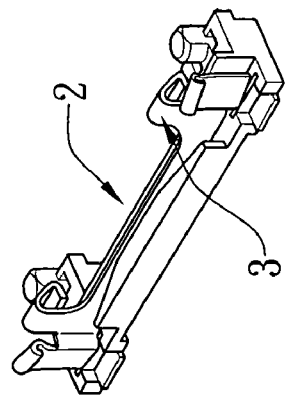
Figure 12:
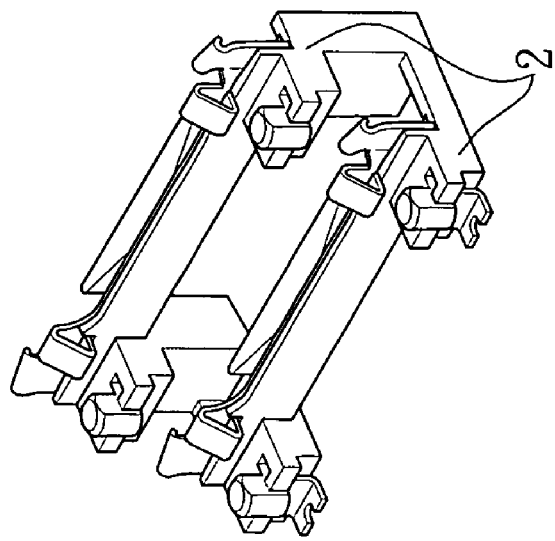
FIG. 12 is a perspective view of an alternative set of two card edge connectors and two latches formed for two circuit cards inserted upward and downward according the present invention.
Figure 12:
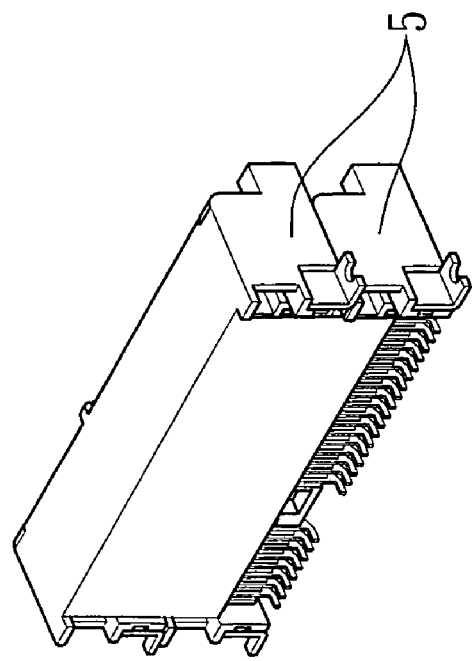

The latch of the present invention includes a variety of types to match different types of card edge connectors for designing or applying, as shown in FIGS. 10–12. As shown in FIG. 10, two card edge connectors 5 are provided; the left one and the right one are adjacent side by side. Two latches are correspondingly located on a certain plane directly toward the sockets 1 of the card edge connectors 5 for two circuit cards inserted leftward and rightward. As shown in FIG. 11, two card edge connectors 5 are provided; the front one and the back one are adjacent side by side. Two latches are correspondingly located on a certain plane directly toward the sockets 1 of the card edge connectors 5 for two circuit cards inserted forward and backward. As shown in FIG. 12, two card edge connectors 5 are provided; the top one and the bottom are stacked. Two latches are correspondingly located on a certain plane directly toward the sockets 1 of the card edge connectors 5 for two circuit cards inserted upward and downward.

Accordingly, a latch of a card edge connector of the present invention is separate from the card edge connector. Designations of the latch of the present invention are different from the conventional latch formed integrally. Thus, defects of the conventional latch that the two supporting arms easily occur deformations and breakdowns can be avoided. Locking effects for fixing the circuit card tightly and firmly is also improved. In a preferred embodiment, a designation of a latch is that the latch is inserted into and combined with an elongated body, thus a simple structure and easy assembly of the latch is achieved. The simple structure can also lock circuit cards tightly and firmly.

What is claimed is:

1. A latch of a card edge connector, for locating on a certain plane directly toward a socket of the card edge connector, comprising:
    an elongated body, having a side wall with an extending wall, wherein a trench is formed between the side wall and the extending wall, and the extending wall has an opening and a pin; and
    a latching device, having a knot and a pinhole used for joining the opening and the pin of the extending wall respectively, and having at least a buckle and a chuck, wherein the buckle is used for locking a circuit card when a side part of the circuit card is pressed down the buckle, and the chuck is used for driving the buckle moving and releasing the circuit card.

2. The latch of a card edge connector as recited in claim 1, wherein the chuck can be two individual pieces formed on each side of the latching device.

3. The latch of a card edge connector as recited in claim 1, wherein bottoms of the elongated body have joint parts for joining a printed circuit board.

4. The latch of a card edge connector as recited in claim 1, wherein the joint parts are fixed on the printed circuit board by welding.

5. The latch of a card edge connector as recited in claim 1, wherein the joint parts are fixed on the printed circuit board by screwing.

6. The latch of a card edge connector as recited in claim 1, wherein the buckle can be two individual pieces located on the latching device separately.

7. The latch of a card edge connector as recited in claim 1 or 6, wherein the buckles are formed like a hook shape; the buckles each has a inclined plane and a pushing part, a side part of the circuit card is pressed down the inclined planes of the buckles then forced against the pushing parts when the circuit card is connected.

8. The latch of a card edge connector as recited in claim 1, wherein the elongated body comprises an inside wall and an outside wall, the inside wall is directly toward the socket of the card edge connector and has at least a platform for placing the circuit card, then the extending wall is formed by expending the outside wall and the trench is thus formed between the outside wall and the extending wall.

9. The latch of a card edge connector as recited in claim 8, wherein the buckle is extended from the outside wall toward the inside wall and can fasten tops of the elongated body, the circuit card is firmly locked on the platform by the buckle when the side part of the circuit card is pressed down the buckle.

10. The latch of a card edge connector as recited in claim 8, wherein the platform of the inside wall of the card edge connector can be two individual pieces located on the each end of the inside wall.

11. The latch of a card edge connector as recited in claim 10, wherein the two platform each has a bulge located on the same side of the each platform, and the bulges are used for connecting with linking holes of one side of the circuit card.

12. The latch of a card edge connector as recited in claim 11, wherein the two bulges each has a guiding angle for connecting the bulges with the linking holes smoothly.

13. A card edge connector comprising:
   at least a connector, having a socket for inserting an electric connecting side part of a circuit card; and
   at least a latch, located on a certain plane directly toward the socket of the card edge connector, the latch comprising:
   an elongated body, having a side wall with an extending wall, wherein a trench is formed between the side wall and the extending wall, and the extending wall has an opening and a pin; and
   a latching device, having a knot and a pinhole used for joining the opening and the pin of the extending wall respectively, and having at least a buckle and a chuck, wherein the buckle is used for locking a circuit card when a side part of the circuit card is pressed down the buckle, and the chuck is used for driving the buckle moving and releasing the circuit card.

14. The card edge connector as recited in claim 13, wherein the connector can be two individual pieces, a left connector and a right connector adjacent side by side, then two latches are correspondingly located on a certain plane directly toward the sockets of the two connectors.

15. The card edge connector as recited in claim 13, wherein the connector can be two individual pieces, a front connector and a back connector adjacent side by side, then two latches are correspondingly located on a certain plane directly toward the sockets of the two connectors.

16. The card edge connector as recited in claim 13, wherein the connector can be two individual pieces, a top connector and a back connector stacked, then two latches are correspondingly located on a certain plane directly toward the sockets of the two connectors.

* * * * *